(12) United States Patent
Kamiya et al.

(10) Patent No.: US 8,034,401 B2
(45) Date of Patent: Oct. 11, 2011

(54) PATTERN FORMING METHOD AND PATTERN FORMING APPARATUS

(75) Inventors: Seiichi Kamiya, Yokohama (JP); Yuji Tsuruoka, Kawasaki (JP); Takashi Mori, Ohta-ku (JP); Nobuhito Yamaguchi, Inagi (JP); Masao Furukawa, Yokohama (JP)

(73) Assignee: Canon Kabushiki kaisha, Tokyo (JP)

( * ) Notice: Subject to any disclaimer, the term of this patent is extended or adjusted under 35 U.S.C. 154(b) by 1219 days.

(21) Appl. No.: 11/447,803

(22) Filed: Jun. 6, 2006

(65) Prior Publication Data

US 2006/0290728 A1   Dec. 28, 2006

(30) Foreign Application Priority Data

Jun. 22, 2005  (JP) .................................. 2005-181620

(51) Int. Cl.
  *B05D 5/12* (2006.01)
  *C23C 16/52* (2006.01)

(52) U.S. Cl. .......................................... 427/96.1; 427/8
(58) Field of Classification Search .............. 427/8, 96.1
   See application file for complete search history.

(56) References Cited

U.S. PATENT DOCUMENTS

| 6,960,481 B2 * | 11/2005 | Yamaguchi | 438/16 |
| 6,997,536 B2 * | 2/2006 | Moon et al. | 347/19 |
| 7,049,527 B1 * | 5/2006 | Miyasaka | 174/261 |
| 7,146,910 B2 * | 12/2006 | Hasei | 101/485 |
| 7,614,712 B2 * | 11/2009 | Kachi | 347/14 |

FOREIGN PATENT DOCUMENTS

| JP | 6-24008 A | 2/1994 |
| JP | 11-163499 A | 6/1999 |

* cited by examiner

*Primary Examiner* — Brian K Talbot
(74) *Attorney, Agent, or Firm* — Canon USA Inc IP Division (57) ABSTRACT

A plurality of conductive patterns are formed so as to be arranged in a scanning direction of a recording head. A state of each of the conductive patterns and a state between the adjacent conductive patterns are electrically checked to detect a wire break and a short circuit in the conductive patterns.

2 Claims, 8 Drawing Sheets

MAIN SCANNING DIRECTION
(RECORDING-HEAD
SCANNING DIRECTION)

DISCHARGE OPENING

MAIN SCANNING DIRECTION

PATTERN FORMING METHOD AND PATTERN FORMING APPARATUS

BACKGROUND OF THE INVENTION

1. Field of the Invention

The present invention relates to a pattern forming method and a pattern forming apparatus that form a conductive pattern on a base material by a liquid discharging method.

2. Description of the Related Art

Circuit boards on which semiconductors, such as LSIs, and various electronic components are mounted are now currently used as the cores of electronic apparatuses, communication apparatuses, and computers. In these circuit boards, a composite of a reinforcing material such as a ceramic or glass fiber, and a synthetic resin such as epoxy resin are frequently used as a base material. However, when a circuit board is incorporated in a small apparatus such as a mobile telephone or a digital camera, a base material is frequently made flexible by being formed of, for example, polyester resin or aramid resin in order to increase mountability. On the other hand, although one-sided boards and double-sided boards have been mainly used heretofore, multilayer circuit boards each including, for example, eight or sixteen circuit-pattern layers are currently dominating the market because size reduction can be achieved and the integration level of the apparatuses can be increased. In addition, the definition and density of circuit patterns have been rapidly increased with the increase in the speed of electronic circuits.

Various methods are used to form a circuit pattern on a circuit board. Japanese Patent Laid-Open No. 11-163499 discloses a method for forming a circuit pattern by a liquid discharging method (inkjet recording). The use of the liquid discharging method reduces the machining cost and overcomes an environmental problem of waste disposal, compared with known subtractive processes. Moreover, the liquid discharging method provides other advantages, for example, high-speed recording is possible, the running cost is low, space saving of the apparatus can be easily achieved, and noise is low. While the liquid discharging method is basically used for recording, it is promising for applications to various industrial fields, for example, formation of circuit patterns on circuit boards, formation of pixels in color filters, formation of luminescent layers of organic electroluminescent elements and electron emission elements of electron sources, and production of microlenses.

The above-described publication discloses that a pattern composed of a conductive pattern and an insulating pattern is formed as a circuit pattern on a base material by discharging a conductive-pattern solution and an insulating-pattern solution from a liquid discharging head.

However, the use of the liquid discharging method causes a new specific problem. That is, a circuit pattern is recorded by discharging a solution for the circuit pattern from discharge openings provided corresponding to recording elements (for example, heating elements or piezoelectric elements) in the liquid discharging method. If any of the recording elements does not perform discharging for some time, evaporation of the solution proceeds at the discharge opening corresponding to the recording element, and the residual component sometimes sticks to the adjacency of the discharge opening.

Figure 1A:
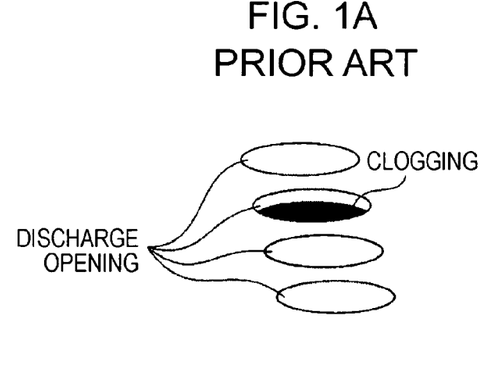
FIGS. 1A and 1B are schematic views showing states in which sticking is caused at discharge openings.
Figure 1B:
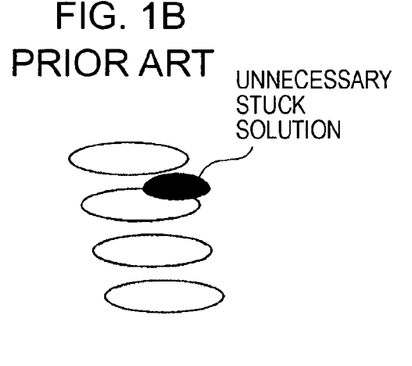

FIGS. 1A and 1B are schematic views showing states in which the above-described sticking is caused at a discharge opening. FIG. 1A shows a state in which one discharge opening is clogged with sticking solution, and FIG. 1B shows a state in which the solution sticks outside the discharge opening.

Figures 2A, 2B, 2C:
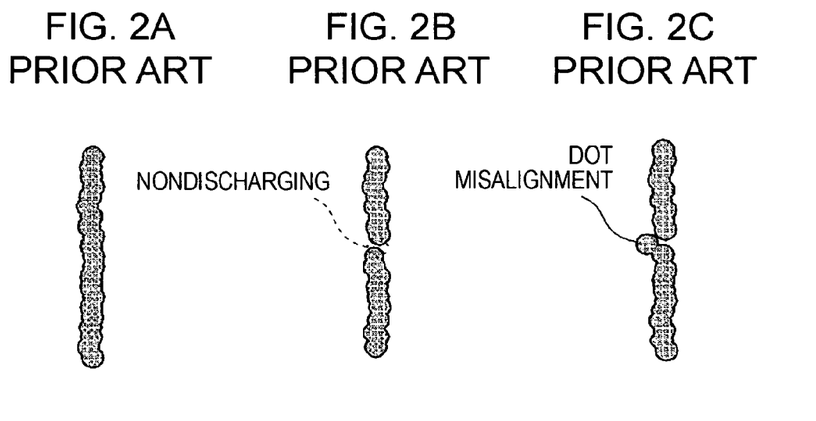
FIGS. 2A to 2C are schematic views showing adverse effects caused in a circuit pattern.

FIGS. 2A to 2C are schematic views showing adverse effects on a circuit pattern recorded with a recording head in which sticking of the solution occurs, as shown in FIGS. 1A and 1B. FIG. 2A shows a linear pattern normally recorded in a state in which the above-described clogging and sticking do not occur at any of a plurality of discharge openings of the recording head. FIG. 2B shows a linear pattern recorded in a state in which one of the discharge openings is clogged, as shown in FIG. 1A. Since discharging from the clogged discharge opening is impossible, no solution is applied in a portion of the linear pattern. This leads to a wire break of the linear pattern. Hereinafter, this state in which discharging of the solution is impossible is referred to as a nondischarging state.

FIG. 2C shows a linear pattern recorded in a state in which a foreign substance sticks to the rim of a discharge opening, as shown in FIG. 1B. Since discharging is performed in such a state in which the foreign substance sticks near the discharge opening, position error is caused by deviation of the discharging direction, and a solution droplet lands at a position displaced from a desired position on a base material. As a result, a wire break occurs in the circuit pattern. When the displaced landing droplet comes into contact with another pattern, a short circuit occurs. Hereinafter, landing of the solution droplet at an undesirable position will be referred to as dot misalignment. While the substance sticks near the discharge opening in FIGS. 1B and 2C, even when a part of discharged solution sticks near the discharge opening, dot misalignment is sometimes caused by the influence on the discharging direction of the solution from the discharge opening. When a wire break in a portion of the circuit pattern or a short circuit between adjacent circuit patterns is thus caused by nondischarging or dot misalignment in the recording head, it is fatal to the recorded circuit pattern.

A method for minimizing these adverse effects is disclosed in Japanese Patent Laid-Open No. 6-24008. In this method, a line pattern is recorded by using all discharge openings of a recording head, as shown in FIGS. 2A to 2C, and it is optically or electronically checked whether there is an unrecorded portion in the line pattern. When the unrecorded portion is detected, the recording head is subjected to recovery operation.

In recent circuit forming technologies, there is an increasing demand to further reduce the weight, thickness, and size of circuit boards. In a circuit forming technology using a liquid discharging method, technical development has also been advanced to form higher-definition patterns. The use of the liquid discharging method generally allows a circuit pattern to be recorded with a line width of approximately ten to tens of microns. In addition, there has been a study report that pattern formation on the order of submicrons is possible.

However, as the integration level thus increases, it becomes more difficult to maintain a high recording accuracy, for the following reasons:

(1) In order to form a high-definition circuit pattern, the lines of the pattern are required to be thinner, thus the number of droplets discharged from each discharge opening is reduced. Therefore, the size of each discharge opening is reduced. The size reduction makes the discharge opening more susceptible to clogging.

(2) When the solution is discharged from the discharge opening, minute droplets (hereinafter referred to as mist) are produced besides main droplets. The influence of the mist increases as the amount of solution to be discharged decreases. Parts of the mist consecutively stick to the adjacency of the discharge opening, and this causes dot misalignment.

(3) For example, even if a foreign substance does not stick, slight dot misalignment easily occurs between a plurality of discharge openings because of the structure of the recording head, that is, the manufacturing error of the discharging openings and foam or a substance sticking to a part of the inner wall of the discharging opening. With the reduction in the line width, the influence of such dot misalignment has become too serious to be ignored.

That is, when high-definition circuits are formed by the liquid discharging method according to the recent demand, not only the above-described problems (1) and (2) are further worsened, but also the new problem (3) is caused.

The method disclosed in the above-described publication can detect the presence or absence of an unrecorded portion in one line pattern, but cannot detect electrical connection (short circuit), that is, the contact between adjacent patterns due to position error of the discharging direction.

SUMMARY OF THE INVENTION

The present invention is directed to a pattern forming method and a pattern forming apparatus. According to one aspect of the present invention, a pattern forming method includes forming a plurality of conductive patterns on a base material by discharging solution from a plurality of discharge openings of a recording head onto the base material while scanning the recording head relative to the base material in a scanning direction intersecting with a direction in which the discharge openings are arranged, the conductive patterns being arranged in the scanning direction; electrically detecting a state of each of the conductive patterns and a state between the adjacent conductive patterns; and forming circuit patterns with the solution on the base material.

In this pattern forming method, it is possible to check not only continuity of each pattern, but also independency of the pattern. Consequently, high-definition conductive patterns can be formed with high reliability.

Further features of the present invention will become apparent from the following description of exemplary embodiments with reference to the attached drawings.

DESCRIPTION OF THE EMBODIMENTS

A circuit-board forming apparatus to which the present invention is applicable will be described below.

Figure 4:
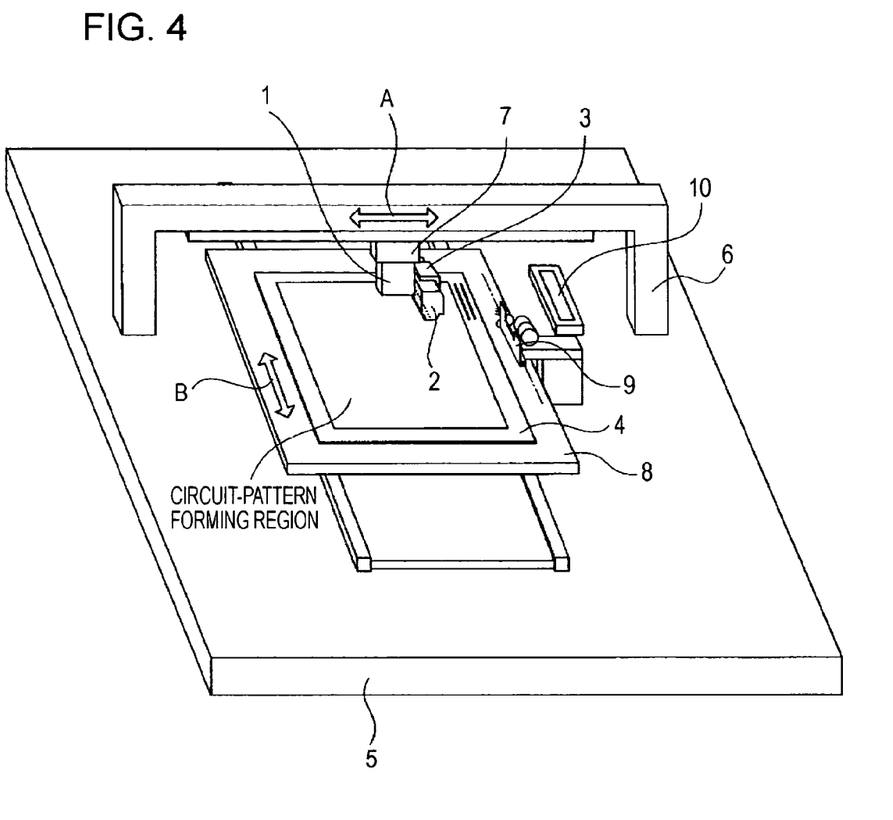
FIG. 4 is a perspective view of a circuit-board forming apparatus using a liquid discharging method that is applicable to embodiments of the present invention.

FIG. 4 is a perspective view of an apparatus (circuit-board forming apparatus) which forms a pattern by using a liquid discharging method, and which is commonly applicable to a plurality of embodiments that will be described below. Referring to FIG. 4, a recording head 2 and a tank 3 are mounted on a carriage 1. The carriage 1 can move in a main scanning direction shown by arrow A along a CR (carriage) linear motor stage 7 that is provided on a gate-shaped base 6.

Figure 5:
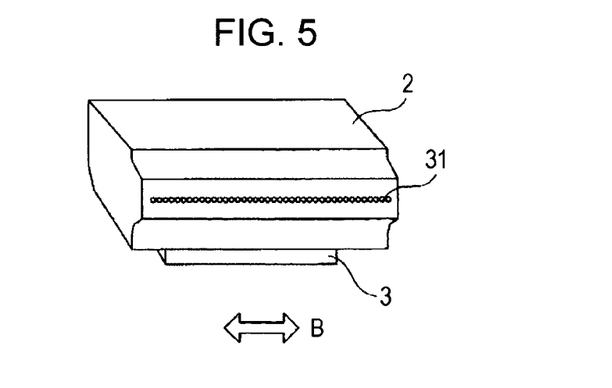
FIG. 5 is a perspective view of a recording head in the circuit-board forming apparatus.

FIG. 5 is a perspective view of the recording head 2. In the recording head 2, a plurality of discharge openings 31 are arranged in a sub-scanning direction shown by arrow B in FIGS. 4 and 5. A solution is supplied from the tank 3 to the discharge openings 31, and is discharged from each of the discharge openings 31. The sub-scanning direction B crosses the main scanning direction A, and can be perpendicular to the main scanning direction A. When the solution is discharged from the discharge openings 31 of the recording head 2 while the carriage 1 is being scanned in the main scanning direction A, a pattern for one scanning line is formed on a base material 4.

The solution can be conductive. In this case, as required, the solution can contain, for example, a metal colloid, a dispersant, water, a water-soluble organic solvent, a viscosity-controlling agent, a pH controlling agent, an antiseptic agent, a surface-active agent, and an antioxidant. The metal collide can be, for example, Ag, Pt, $SnO_2$, Al, Cr, Zn, or Fe. From the viewpoint of conductivity, Ag, $SnO_2$, or Al can be used. While the diameter of collide particles is generally hundreds of nanometers or less, a metal collide having a particle diameter within the range of tens to hundreds of nanometers can be used from the viewpoints of uniformity and stability of the circuit pattern. Within this range, sedimentation of the metal colloid in the solution is suppressed, and preservation stability of the solution can be effectively prevented from decreasing. In the following embodiments, an ionic solution is used as a conductive solution. The conductive solution contains 100% by weight of silver particulates, 6.8% by weight of methylhexahydro phthalic anhydride serving as acid anhydride, and 5% by weight of resol phenol resin serving as a thermosetting resin. The composition of the conductive solution is not limited to the above, and the conductive solution may contain other applicable components. Further, even when the solution itself does not have satisfactory conductivity, it can be used as the solution to be discharged as long as its conductivity can be increased by being subjected to heating or baking later.

The base material 4 generally has a flat shape like a film, a sheet, or a plate. However, the base material 4 may be curved as long as a circuit pattern can be formed thereon by the liquid discharging method. In the following embodiments, a volatile component contained in the solution is evaporated, and a conductive component is fixed on the base material 4, so that a circuit pattern is completed. The base material 4 is formed of, for example, a thermoplastic resin film such as a polyester film, an aromatic polyamide film, or a polyimide film. Alternatively, the base material 4 may be formed of a sheet obtained by impregnating a cloth or a nonwoven cloth, which is made of glass fiber, polyester fiber, or aromatic polyamide fiber, with thermoplastic resin or epoxy resin, and then setting the resin, or a plate such as a glass epoxy multilayer plate popularly used in circuit boards.

Alternatively, for example, the base material 4 may be formed of porous ceramics formed by baking alumina, silica, aluminum nitride, barium titanate, or zirconia, a porous resin film mainly containing polyolefin and inorganic filler, or glass fiber. In this way, it is effective to form the base material 4 of a material that can be subjected to heating and baking. In this case, when the base material 4 is baked by a baking apparatus after a circuit pattern is recorded thereon, the metal colloid contained in the solution is melted, and metallic bonding is achieved. This further increases the conductivity of the circuit pattern.

The gate-shaped base 6 is fixed at a predetermined position on a surface plate 5 in the circuit-board forming apparatus. The CR linear motor stage 7 moves the carriage 1 by linear motor driving, and is supported by the gate-shaped base 6 that has high rigidity. Therefore, the recording head 2 can be scanned in the main scanning direction without displacing relative to the surface plate 5. On the other hand, an LF (line feed) linear motor stage 8 moves the base material 4 in the sub-scanning direction by linear motor driving. Since the LF linear motor stage 8 is also mounted on the surface plate 5, its motion does not displace the surface of the base material 4 relative to the recording head 2. That is, recording (pattern forming) can be carried out while a predetermined distance is maintained between a surface of the recording head 2 that discharges the solution and the surface of the base material 4 on which a circuit pattern is formed.

Although not shown, each of the two linear motor stages 7 and 8 incorporates a linear encoder and an origin sensor to detect the position of the carriage 1 relative to the gate-shaped base 6. The linear encoder and the origin sensor are used as servo control input for linear motor driving.

In the following embodiments, a linear encoder having a resolution of approximately 0.5 micron is used in accordance with the precision of a circuit pattern to be formed. This allows formation of a high-definition circuit pattern having a line width of ten to tens of microns. A signal from the linear encoder provided in the CR linear motor carriage 7 is also used to control the timing at which the solution is discharged from the recording head 2.

When pattern data is input from a host apparatus (not shown) to the circuit-board forming apparatus having the above-described configuration, the carriage 1 starts to scan in the main scanning direction, and simultaneously, discharging from the discharge openings 31 of the recording head 2 is performed according to the pattern data. After the main scanning and recording (pattern formation), the recording material 4 is conveyed in the sub-scanning direction by an amount corresponding to the recording width in the main scanning. By intermittently repeating the main scanning and sub-scanning operations described above, a circuit pattern is gradually formed on the base material 4.

A suction cap 10 shown in FIG. 4 is used for maintenance operation of the recording head 2. The suction cap 10 can be formed of an elastic material such as rubber. By forcibly sucking the solution in the discharge openings 31 while the suction cap 10 is pressed against the discharging surface of the recording head 2, clogging and sticking of the solution near the discharge openings 31 are removed. A normal discharging state of the recording head 2 can be maintained by appropriately performing this suction operation. The suction cap 10 also serves to protect the recording head 2 during a non-operation state. Although not shown, in addition to the suction cap 10, a wiper member for directly removing foreign substances sticking to the discharging surface of the recording head 2 may be provided as a mechanism for performing maintenance of the recording head 2.

A conductive probe 9 shown in FIG. 4 detects a test pattern that is peculiar to the exemplary embodiments of the present invention. Details of the conductive probe 9 will be described below.

A procedure for forming a multilayer circuit board by using the above-described circuit-board forming apparatus will be described in detail in the following embodiments.

Figure 3A:
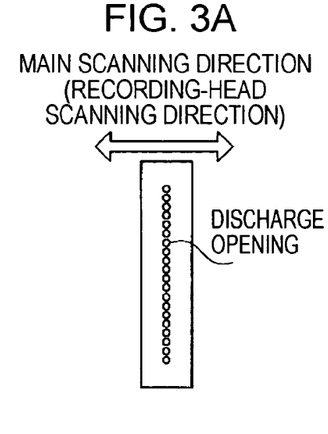
FIGS. 3A to 3C are schematic views showing dot misalignment caused among a plurality of discharge openings.
Figure 3B:
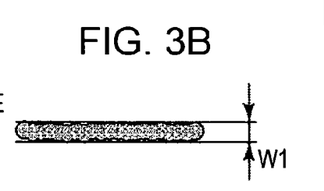
Figure 3C:
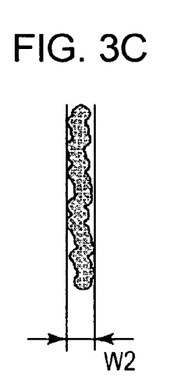

In general, a circuit pattern is formed by combining linear patterns extending in two intersecting directions. FIGS. 3A to 3C are schematic views showing dot misalignment in a circuit pattern recorded on the recording material 4.

FIG. 3A shows a recording head having two discharge openings arranged in a line. The recording head discharges solution from the discharge openings while moving in a main scanning direction shown by the arrow, thereby recording a circuit pattern.

FIG. 3B shows a linear pattern having a line width W1 and formed to extend in the main scanning direction of the recording head. FIG. 3C shows a linear pattern having a line width W2 and formed to extend in the arrangement direction of the discharge openings. The linear pattern shown in FIG. 3B is formed by droplets continuously discharged from one of the discharge openings. Therefore, the linear pattern is not affected by variations among the discharge openings. In contrast, the linear pattern shown in FIG. 3C is formed by droplets discharged simultaneously from all the twenty discharge openings while the recording head is being moved in the main scanning direction. Therefore, the characteristics of the discharge openings, that is, variations in discharging timing and discharging amount are reflected in landing states of dots in this pattern. The line width W2 of the linear pattern including many variations is larger than the line width W1 of the linear pattern that does not include variations. Empirically, the line width W2 is approximately 1.5 to 2.5 times the line width W1 in recent typical circuit-board forming apparatuses.

It is supposed that a plurality of thin lines are formed in parallel and adjacent to each other when the definition of circuits increases and the line width decreases. However, as shown in FIG. 3C, the actual line width is larger than the designed value because of dot misalignment, the adjacent lines may touch each other, and this may cause a short circuit.

Accordingly, in the present exemplary embodiments, a pattern in which various errors among the discharge openings are included and the line shape is easily changed from the ideal state, as shown in FIG. 3C, is used as a test pattern. This allows a circuit pattern to be recorded reliably.

That is, a test pattern in the present exemplary embodiments is formed of a line obtained by discharging solution from all the discharge openings of the recording head that are concerned with recording, and extends along the line of the discharge openings. Further, a test pattern includes a plurality of lines equally spaced in the main scanning direction. Therefore, it is possible to check not only continuity of each line in the test circuit pattern, but also independence of the line.

By using this test pattern, when a desired circuit pattern is formed, it can be checked whether the discharging state of the recording head is stable, and a high-definition circuit pattern can be formed with high reliability.

First Embodiment

Figure 6:
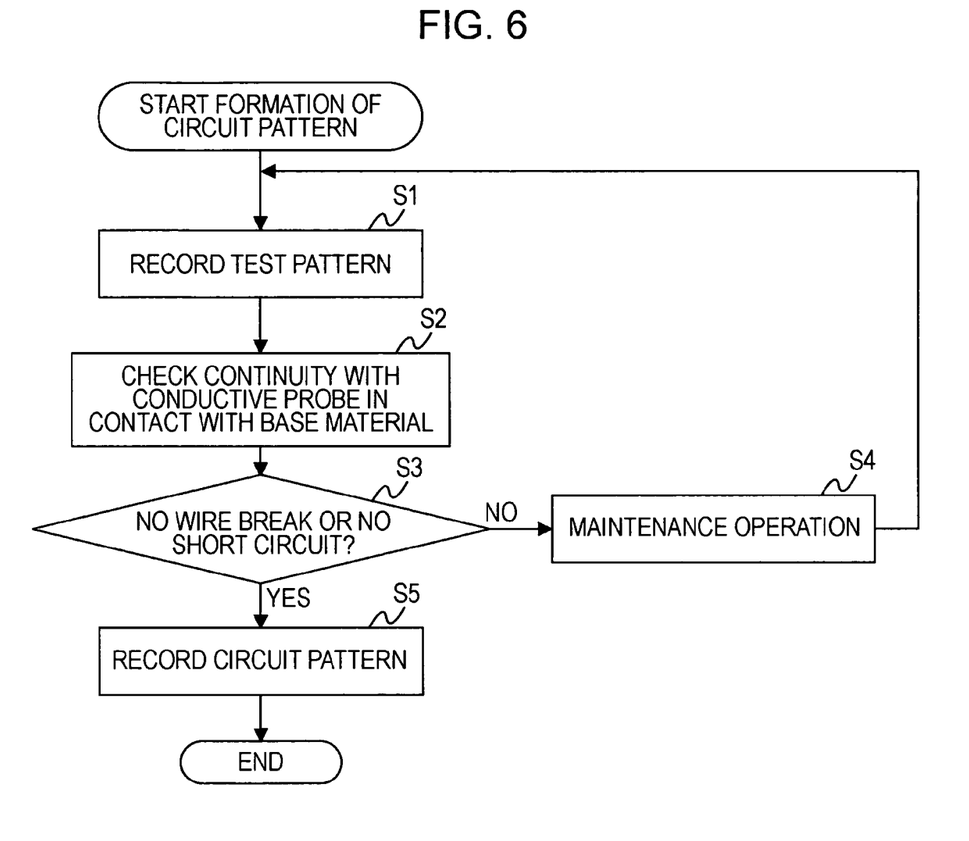
FIG. 6 is a flowchart showing a procedure for forming a circuit pattern.

FIG. 6 is a flowchart showing a procedure for forming a circuit pattern in a first embodiment of the present invention.

When an input command for a circuit pattern is received from the host apparatus, the circuit-board forming apparatus first records a test pattern (Step S1). More specifically, the recording head 2 is moved outside a circuit-pattern recording region by the CR linear motor stage 7, and records a predetermined test pattern at that position.

Figure 7A:
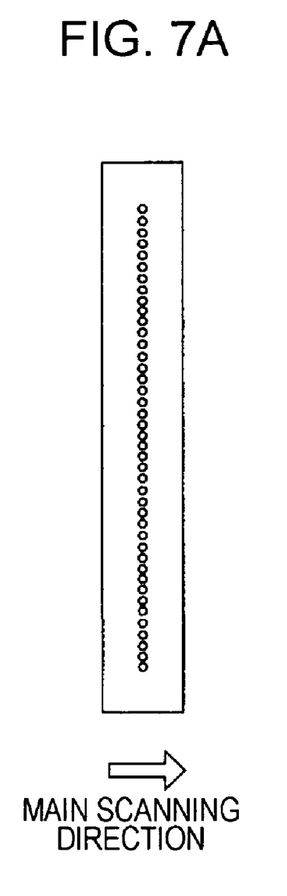
FIGS. 7A to 7C are schematic views showing recorded test patterns.
Figure 7B:
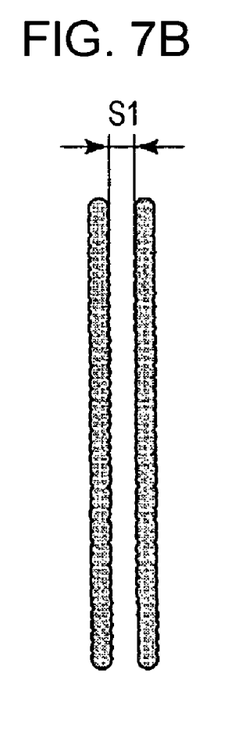
Figure 7C:
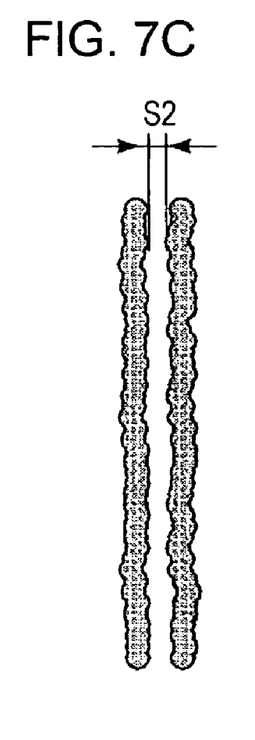

FIGS. 7B and 7C show a test pattern recorded in the first embodiment. The test pattern is linear so as to extend along the line of the discharge openings of the recording head shown in FIG. 7A, and includes two lines arranged with a predetermined space therebetween in the main scanning direction. The two lines are formed by discharging solution at predetermined timings from all the discharge openings that are concerned with recording. FIG. 7B shows lines that are ideal in design. In contrast, FIG. 7C shows lines actually formed by the recording head used in the first embodiment. As described above with reference to FIGS. 3A to 3C, the recorded lines extending in the sub-scanning direction (extending along the line of the discharge openings) include various errors among the discharge openings. Therefore, the linearity of the lines is lower than that of the ideal lines.

The space between two lines formed as a test pattern on the base material 4, that is, the line space is designated by S. In FIG. 7B, S1 shows a designed line space between two lines. In FIG. 7C, S2 shows an actual line space between two lines. The space width S2 defined by the two lines having insufficient linearity is smaller than the line space S1. However small the actual line space S2 becomes, the circuit can normally function as long as the two lines extend independently and continuously.

Since the test pattern composed of the two lines is used to check whether an actual circuit pattern is normally recorded, the line space S between the two lines can be less than or equal to the minimum line space of a pattern actually formed as a circuit. Therefore, in the first embodiment, the line space S1 between the lines in the test pattern is set to be equal to the minimum line space of a pattern that is actually formed on the base material. By recording this test pattern and then checking whether two lines of the test pattern are normal, it is determined whether recording of a circuit pattern should be actually performed. While the line space between the two lines is set to be equal to the minimum line space of an actually recorded pattern in the above, circuits can be more precisely formed by setting the line space at a smaller value.

It is determined whether the designed line space S1 between the lines in the test pattern after the actual line width W2 of the lines extending along the line of the discharge openings is sufficiently obtained. This is because the line width W2 greatly varies depending on the amount of solution discharged from the discharge openings and other errors, and this has a great effect on the risk of contact between the two adjacent lines. In the first embodiment, the line width W1 is designed at about 20 µm, and the line space S1 between the lines is designed at about 30 µm.

Referring again to FIG. 6, when recording of the test pattern is completed in Step S1, it is checked in Step S2 whether each line in the recorded test pattern normally functions. In the first embodiment, the conductive probe 9 is used for this checking operation.

FIGS. 8A to 8D are enlarged views showing the structure and motion of the conductive probe 9. The conductive probe 9 includes four probe cores 13, and the probe cores 13 can be moved into contact with and away from the base material.

Figure 8A:
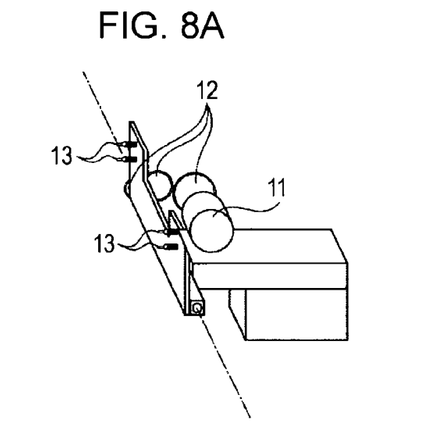
FIGS. 8A to 8D are schematic views showing the configuration and motion of a conductive probe.
Figure 8B:
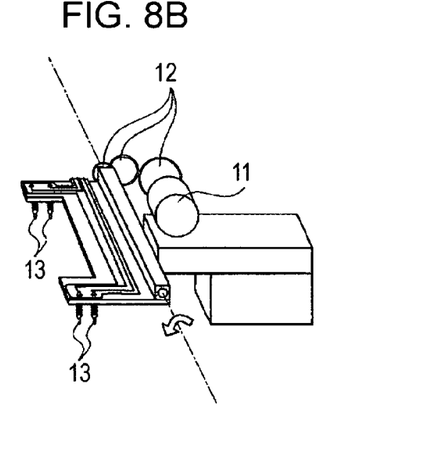

FIG. 8A shows a state in which the probes 13 are separate from the base material, and FIG. 8B shows a state in which the probe cores 13 are in contact with the base material. The contact and separation of the probe cores 13 with and from the base material are controlled by a motor 11 and gears 12 provided in the conductive probe 9.

Figure 8C:
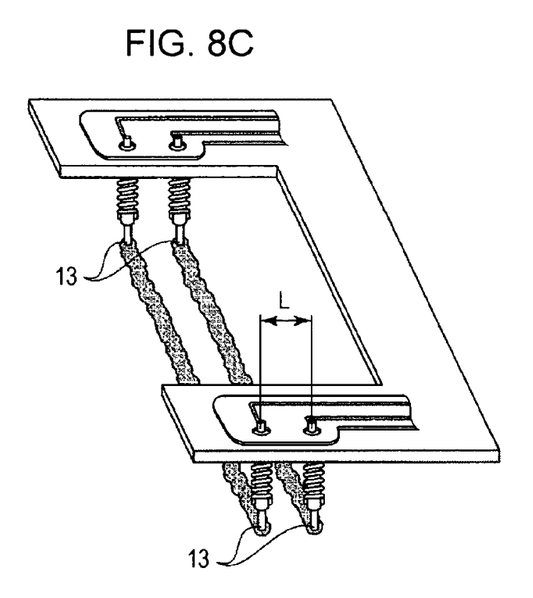

In the first embodiment, the four probe cores 13 are arranged so that leading ends thereof are respectively in contact with ends of two lines recorded in Step S1, as shown in FIG. 8C. The probe cores 13 are controlled to be simultaneously brought into contact with the lines.

Figure 8D:
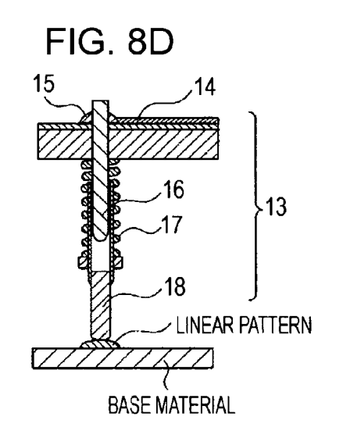

FIG. 8D is a cross-sectional view showing a detailed structure of each probe core 13. A movable needle 18 provided at the leading end of the probe core 13 is in contact with a conductive test pattern provided on the base material 4. Information about whether the current flow is allowed by the contact is transmitted to a fixed needle 16 provided above the movable needle 18. An upper portion of the fixed needle 16 is connected to a flexible cable 14 by soldering, and is fixed at a connecting portion 15. A pressure spring 17 is provided around the fixed needle 16, and allows the movable needle 18 to vertically move relative to the fixed needle 16. The flexible cable 14 is connected to a continuity checking circuit (not shown).

Since the recorded test pattern is conductive, a wire break and a short circuit of the lines can be detected by checking the four probe cores 13 for continuity.

Figure 9:
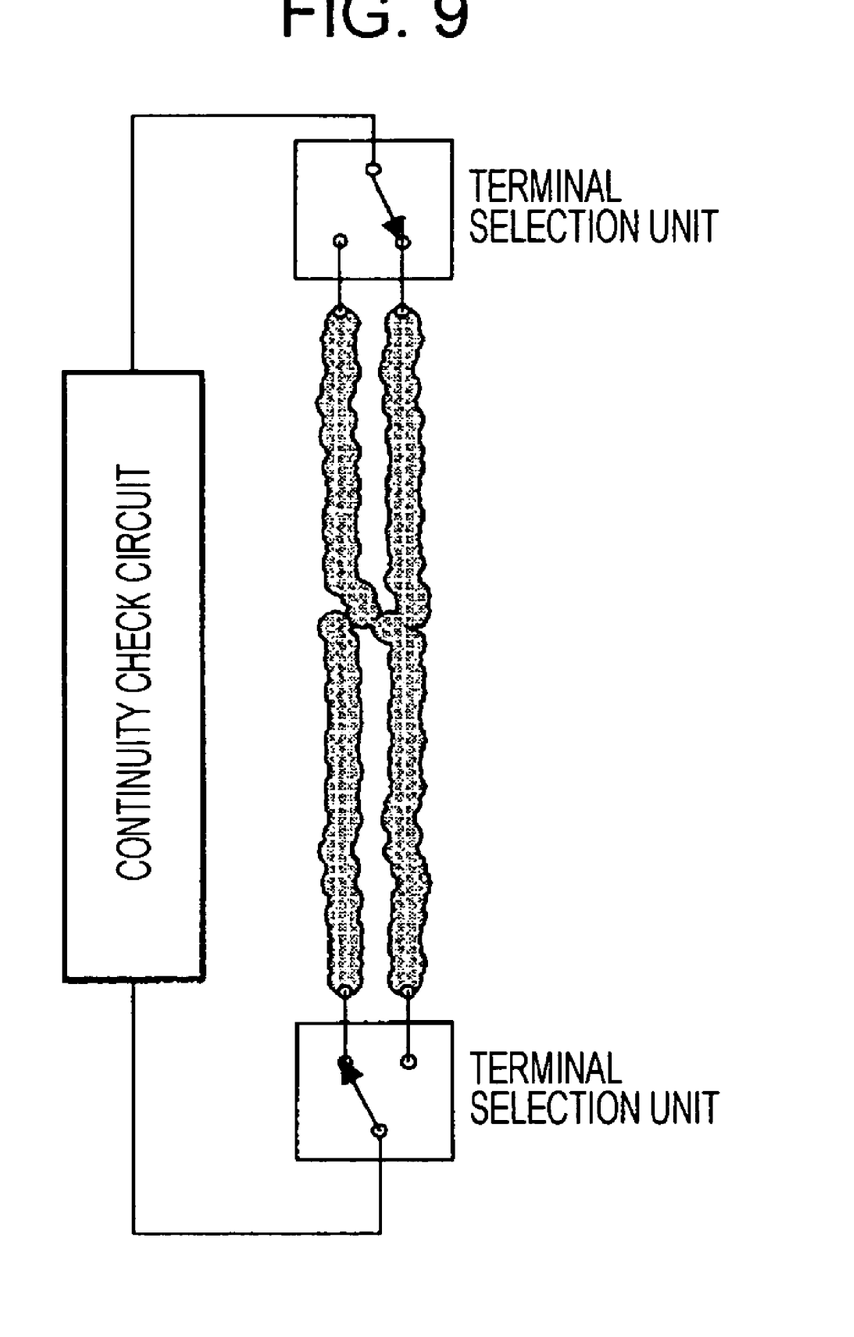
FIG. 9 is a circuit diagram showing a terminal selection state during checking of a test pattern.

FIG. 9 is a circuit diagram showing a terminal selection state during checking of the test pattern for a wire break and a short circuit. When each line is checked for a wire break, switching is performed so that two terminal units are connected to the probe cores that are in contact with the same line. In contrast, when a short circuit between the two lines is checked, switching is performed so that the terminal units are connected to the probe cores that are in contact with the different lines.

Figure 10A:
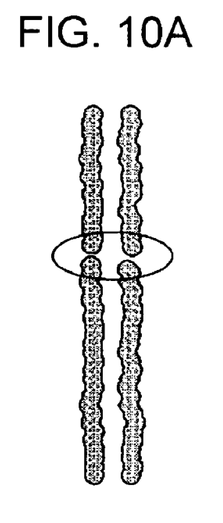
FIGS. 10A to 10C are schematic views showing a wire break and a short circuit caused in the test pattern.
Figure 10B:
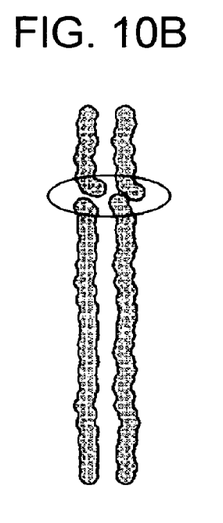
Figure 10C:
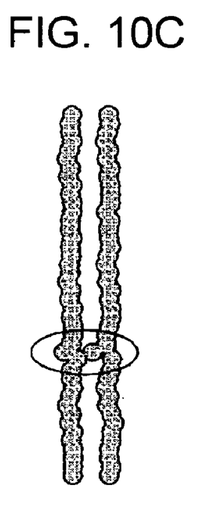

FIGS. 10A to 10C show various adverse effects on the test pattern. FIG. 10A shows a case in which one of the discharge openings is incapable of discharging. FIG. 10B shows a case in which dot misalignment occurs in one of the discharge openings. In this case, a wire break is found in each of the lines. FIG. 10C shows a case in which the lines are in contact with each other because of dot misalignment. In the case shown in FIG. 10C, a wire break is not found in both lines, but an electrical connection, that is, a short circuit between the lines is found.

Referring again to FIG. 6, after the above-described continuity checking operation is performed in Step S2, it is determined in Step S3 whether a wire break or a short circuit has been found in Step S2. When a wire break or a short circuit has been found, a recovery operation for the recording head is performed in Step S4. That is, the discharging state of the recording head is adjusted by forcibly performing a suction operation with the cap 10 pressed against the discharging surface of the recording head 2, or by performing preliminary discharging. Then, Step S1 is performed again to record a new test pattern by the recovered recording head 2. In this case, the test pattern is recorded outside the circuit-pattern recording region and at a position different from the position where the previous test pattern was recorded.

In contrast, when a wire break or a short circuit has not been found in Step S3, an actual circuit pattern is recorded in Step S5, and this procedure is completed.

In the above-described embodiment, the maintenance operation is performed every time a wire break or a short circuit is found. In this case, however, the maintenance operation is improperly repeated when the recording head itself is defective. Accordingly, other countermeasures can be taken, such as, replacing the recording head or making the line space in the circuit pattern larger than that in the test pattern when the recording state is not improved even by performing the maintenance operation several times.

As described above, in the first embodiment, prior to recording of a circuit pattern, two lines are recorded as a test pattern by discharging solution from the discharge openings that are used to record the circuit pattern. After that, the two lines are checked for a wire break and a short circuit in order to determine whether the state of the recording head is proper for recording of the circuit pattern. This allows a high-definition circuit pattern to be recorded with high reliability.

While two lines are recorded as a test pattern in the first embodiment, the number of the lines may be more than two.

Second Embodiment

A second embodiment of the present invention will be described below. One merit of using the liquid discharging method to form a circuit pattern is its capability for easily producing various types of circuit boards in low volumes. When large circuit pattern data is stored in the host apparatus, circuit boards having different circuit patterns can be formed successively.

In this case, it can be supposed that a plurality of circuit patterns are different in the integration level, and in the line space S between the lines that should be guaranteed to prevent a short circuit. When a circuit board, in which the line space between lines of a circuit pattern is relatively large, is produced, if the line space S between the lines in the test pattern is smaller than necessary, checking is too strict. From the viewpoint of circuit formation yield, it is not necessary to check the recording head under a condition that is stricter than necessary.

Accordingly, in a circuit-board forming apparatus of the second embodiment, the line space S between two lines in a test pattern is adjusted in accordance with a circuit pattern to be recorded. In addition, the circuit-board forming apparatus includes a conductive probe in which the layout of the probe cores can be adjusted in accordance with the line space S. Descriptions of components similar to those in the first embodiment are omitted.

Figure 11:
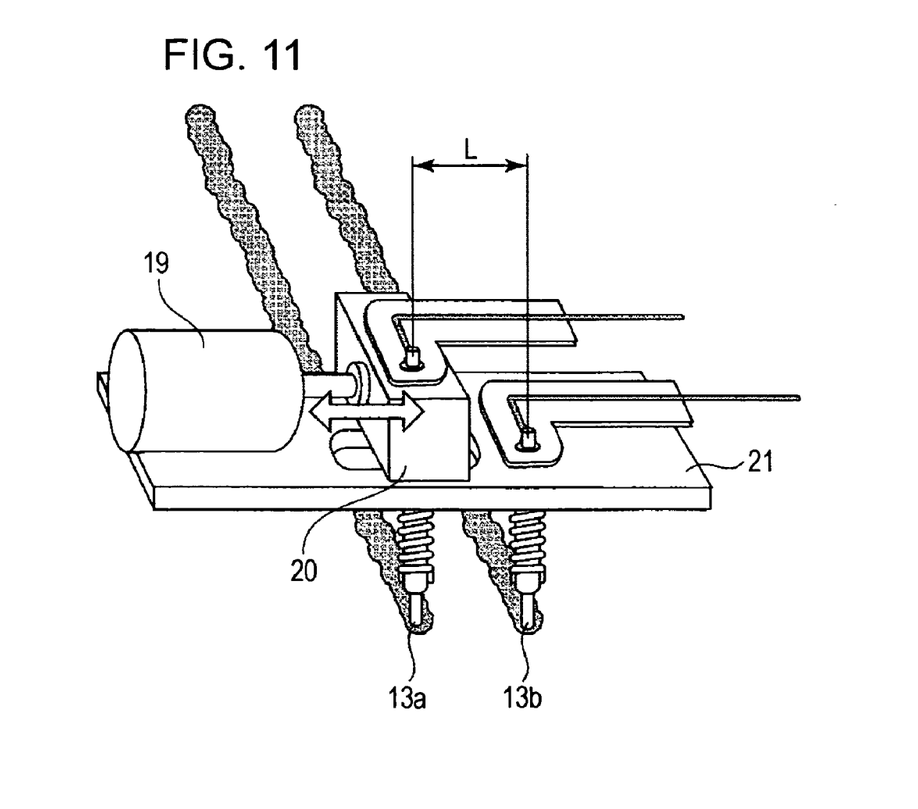
FIG. 11 is a schematic view showing probe cores that are arranged so that the distance therebetween is adjustable.

FIG. 11 shows two probe cores of a conductive probe used in the second embodiment. The distance between the probe cores is variable. A microactuator 19, which is peculiar to the second embodiment, is a driving mechanism that is capable of scanning on the order of micrometers. A movable base 20 on which one probe core 13a is mounted is fixed to the leading end of the microactuator 19. Therefore, when the microactuator 19 is driven in a main scanning direction (shown by the arrow in FIG. 11), the probe needle 13a can be moved in the same direction, and the distance L between the probe core 13a and the other probe core 13b can thereby be adjusted to the line space S of the test pattern. In the conductive probe 9 of the second embodiment, a similar microactuator 19 is provided for another pair of probe cores that measure opposite ends of the lines of the test pattern. The microactuator 19 and the other probe core 13b are fixed on the same base 21 in the conductive probe, and the base 21 also supports the other pair of probe cores. With the above-described structure, the distance between each pair of probe cores is adjusted while the probe cores are kept in parallel with each other.

In the second embodiment, a procedure for forming a circuit pattern can also be described with reference to FIG. 6 serving as a flowchart.

First, in Step S1, a test pattern is recorded after the line space S is adjusted in accordance with a circuit pattern to be formed later. In Step S2, the position of the probe core 13a is adjusted by the microactuator 19 so that the distance L between the probe cores 13a and 13b becomes equal to a predetermined line space. Subsequently, the probe cores 13a and 13b are brought into contact with a surface of a base material on which the test pattern is recorded. In this state, continuity is checked in a manner similar to that in the first embodiment. Subsequent steps are similar to those in the first embodiment.

As described above, in the second embodiment, prior to recording of a circuit pattern, two lines are recorded as a test pattern while the line space S between the lines is determined in accordance with the circuit pattern, and the two lines are then checked for a wire break and a short circuit, so that it is determined whether the state of the used recording head is proper for recording of the circuit pattern. This allows the test pattern to be checked in a manner suited to the integration level of the circuit pattern.

In the above-described embodiments, a volatile conductive solution, which does not need to be subjected to other processes such as heating, is used so that the step of checking the recording head and the step of forming a circuit pattern can be performed more efficiently and in a shorter period. While the test pattern is recorded on the same base material as that for the circuit pattern, the present invention is not limited thereto.

When the used solution is caused by heating or baking to exhibit conductivity, heating or baking is performed after a test pattern is formed, and a circuit pattern is recorded after the test pattern is checked for continuity. In this case, the circuit pattern and the test pattern do not always need to be recorded on the same base material. The object of the present invention can be achieved as long as a test pattern can be formed in a state equivalent to a state in which an actual circuit pattern is formed.

While the test pattern is recorded and checked before the circuit pattern is formed in the above embodiments, checking may be performed with a test pattern at an appropriate timing during recording of a circuit pattern. For example, in a case in which there is a risk of sticking of foreign substances such as mist, which may cause position error, near the discharge openings, when the number of discharging operations exceeds a predetermined number, a test pattern may be formed and checked after the predetermined number of discharging operation are performed. When any of the discharge openings is not used for a predetermined period during the recording process for a circuit pattern, a test pattern may be recorded and checked after the predetermined period passes.

While the circuit-board forming apparatus includes the conductive probe for checking the test pattern in the above embodiments, the present invention is not limited to this apparatus. The present invention also includes an apparatus having any means that checks a test pattern for a wire break and a short circuit after a plurality of lines are recorded as the test pattern.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2005-181620, filed Jun. 22, 2005, which is hereby incorporated by reference herein in its entirety.

What is claimed is:

1. A pattern forming method comprising:

forming a test pattern by forming a plurality of lines for testing along a direction of a discharge opening row with a predetermined interval therebetween in a scanning direction, by relatively scanning a discharge head having the discharge opening row, in which a plurality of discharge openings are arranged, and a board in a direction intersecting the discharge opening row, and by discharging conductive solution from the discharge opening to the board;

confirming electric conductivity among the plurality of lines for testing; and forming a circuit pattern by forming a plurality of lines for the circuit pattern on a board after confirming electric conductivity, wherein length of the intervals between the plurality of lines for testing is shorter than length of intervals between the plurality of lines for the circuit pattern.

2. The pattern forming method according to claim 1, wherein the distance between the adjacent lines for testing in the scanning direction is variable depending on the distance between the plurality of lines for the circuit pattern formed on the base material.

* * * * *